US006620287B2

(12) United States Patent
Cass

(10) Patent No.: US 6,620,287 B2
(45) Date of Patent: Sep. 16, 2003

(54) LARGE-AREA FIBER COMPOSITE WITH HIGH FIBER CONSISTENCY

(76) Inventor: Richard B. Cass, 24 Dutch La., Ringoes, NJ (US) 08551

( * ) Notice: Subject to any disclaimer, the term of this patent is extended or adjusted under 35 U.S.C. 154(b) by 21 days.

(21) Appl. No.: 09/834,305

(22) Filed: Apr. 12, 2001

(65) Prior Publication Data

US 2002/0011300 A1 Jan. 31, 2002

Related U.S. Application Data

(60) Provisional application No. 60/196,427, filed on Apr. 12, 2000.

(51) Int. Cl.[7] .............................................. B32B 31/12
(52) U.S. Cl. ..................... 156/296; 156/180; 264/108; 264/125; 264/437; 29/25.35; 29/458; 310/358; 310/364
(58) Field of Search ................ 156/296, 180; 264/437, 125, 108; 29/25.35, 428, 458; 310/357, 358, 364

(56) References Cited

U.S. PATENT DOCUMENTS

| | | | |
|---|---|---|---|
| 4,933,230 A | 6/1990 | Card et al. | 428/242 |
| 5,072,035 A | 12/1991 | Chen et al. | 252/62.9 |
| 5,334,903 A | 8/1994 | Smith | 310/358 |
| 5,615,466 A | 4/1997 | Safari et al. | 29/25.35 |
| 5,796,207 A | 8/1998 | Safari et al. | 310/358 |
| 5,827,797 A | 10/1998 | Cass et al. | 505/430 |
| 5,869,189 A | 2/1999 | Hagood, IV et al. | 428/461 |

*Primary Examiner*—Sam Chuan Yao
(74) *Attorney, Agent, or Firm*—Synnestvedt & Lechner LLP

(57) ABSTRACT

A method of manufacturing a fiber assembly, the method comprising: (a) providing a plurality of layers, each layer comprising sintered fibers of piezoelectric material aligned substantially parallel; (b) laminating the plurality of layers; and (c) applying a matrix material to the laminated layers to affix the layers and form a fiber assembly.

15 Claims, 3 Drawing Sheets

LARGE-AREA FIBER COMPOSITE WITH HIGH FIBER CONSISTENCY

REFERENCE TO RELATED CASE

This case is based on provisional application No. 60/196,427, filed Apr. 12, 2000, which is hereby incorporated by reference in its entirety.

FIELD OF THE INVENTION

The present invention relates generally to assemblies of ceramic fibers, and, more specifically, to assemblies of piezoelectric materials and the uses therefor.

BACKGROUND OF THE INVENTION

Piezoelectric materials are materials which have an electrical response to being deformed or stressed, and conversely, deform or "actuate" in response to an applied voltage. The ability of piezoelectric material to translate between electrical signals and physical deformation renders them useful in various applications. For example, the inventors have identified applications in which the piezoelectric materials are used for energy harvesting, actuating, sensing, transmitting/receiving waves, and combinations thereof. These applications, however, often require the piezoelectric material to be formed into a fiber composite having a relatively large active surface area compared to traditional fiber composites. Traditional fiber composites tend to be limited in size due to the low strength properties of commonly used piezoelectric materials, such as PZT (lead zirconium titanate).

Prior art approaches for overcoming the weakness of piezoelectric materials to produce a fiber composite having a relatively large surface area have been met with limited success. For example, a common approach for providing fiber composites having a relatively large area involves a diced and filled piezoelectric substrate. More specifically, the piezoelectric substrate is diced by forming a number of perpendicular channels through it. Next, the channels are back filled with a plastic or other high-strength material. Although this approach strengthens the piezoelectric substrate and allows for large active surfaces, it suffers from a number of significant shortcomings, one of the most significant being the occurrence of the Lamb wave mode of vibration. The Lamb wave mode of vibration is created by the lateral motion of the various channels which induces an overall resonance in the fiber composite.

The inventors have developed another approach to prepare fiber composites which involves forming a "fiber rope" of piezoelectric material in fiber form. More specifically, individual fibers of piezoelectric material are prepared using known processes such as those described in U.S. Pat. No. 5,827,797 (which has a common assignee to the present application), incorporated herein by reference. A bundle of these fibers then is braided or otherwise bound together and sintered. After sintering, an epoxy or other suitable matrix material can be added to the sintered bundle to impart strength. At this point, individual fiber composites can be sectioned from the fiber rope. Each fiber composite is a cross section of the fiber rope and has two planar, parallel opposing sides or active surfaces. The fibers are substantially normal to the active surfaces and thus their poling direction is normal to the active surface. Having the piezoelectric poling direction substantially normal to the active surface is a desirable property of a fiber composite.

The use of fiber avoids the occurrence of the Lamb wave mode of vibration since fibers tend to have narrow diameters, and, thus, their radial secondary poling direction is minimal (see, e.g., U.S. Pat. No. 5,869,189, incorporated herein by reference). In other words, the radial movement of fibers tends to be very little—most of their poling direction is along their length. Additionally, the random diameter and packing of fibers also tends to minimize harmonics.

Although the use of fiber rope avoids the Lamb wave mode of vibration, fiber ropes are nevertheless faced with other significant shortcomings. Perhaps the most significant shortcoming is their limitation in size. More specifically, it has been found that fiber ropes greater than about 1¼ in diameter are difficult to produce due to the lack of control over fiber consistency. More specifically, the fibers toward the perimeter of the rope tend to be more tightly packed than the fibers toward the center. This condition worsens as the diameter of the rope increases.

Therefore, a need exists for a piezoelectric fiber composite which has a large active surface but which is not susceptible to Lamb wave mode harmonics and is not limited in area. The present invention fulfills this need among others.

SUMMARY OF THE INVENTION

The present invention provides for a piezoelectric fiber composite which has a large active surface and a high degree of fiber consistency. The fiber composite of the present invention avoids the aforementioned problems by using small subassemblies or thin layers of fiber in which fiber consistency can be controlled to form a large fiber assembly having sufficient overall fiber consistency. In other words, the inventors have recognized that the most effective way of controlling the fiber consistency of an entire assembly is by controlling the fiber consistency of its smaller components. After the large fiber assembly is formed, thin fiber composites having opposing (active) surfaces can be sectioned.

By sectioning the fiber composites from a large assembly of consistently arranged fibers, the present invention overcomes the various problems in the prior art. More specifically, since fibers are being used, issues with respect to Lamb wave mode harmonics are avoided as discussed above with respect to the fiber rope. Furthermore, since the fiber assembly comprises the conglomeration of a number of smaller components in which fiber consistency can be readily maintained, the size of the fiber assembly is not limited by fiber consistency. The individual fiber composites are sectioned off from the fiber assembly at the desired thickness and thus have an active surface as large as any side of the fiber assembly.

One aspect of the present invention is a method of preparing a fiber assembly having a large cross section and fiber consistency. In a preferred embodiment, the method comprises: (a) providing a plurality of layers, each layer comprising sintered fibers of piezoelectric material aligned substantially parallel; (b) laminating the plurality of layers; and (c) applying a matrix material to the laminated layers to affix the layers and form a fiber assembly. Having a large assemblage of fibers allows cross sections of the assemblage to be removed as fiber composites. Accordingly, in a preferred embodiment, the method further comprises sectioning a portion from the fiber assembly wherein the portion has two opposing surfaces and contains fibers that are substantially normal to the opposing surfaces. The method also preferably comprises applying an electrode to each opposing surface.

Another aspect of the present invention is the product made from the process described above. In a preferred embodiment, the product comprises a fiber composite comprising: (a) two opposing surfaces, wherein each opposing surface has an area greater than about 1.5 in$^2$; (b) a plurality of piezoelectric fibers wherein the variation of fiber concentration/cm$^3$ of fiber composite throughout the fiber composite does not exceed 20% of the overall fiber concentration of the fiber composite; and (c) a matrix material binding the fibers.

Another aspect of the present invention is the use of the piezoelectric fiber composite described above. In a preferred embodiment, the fiber composite is used for energy harvesting, sensing, wave transmitting/receiving and combinations thereof.

DETAILED DESCRIPTION OF PREFERRED EMBODIMENTS

Figure 1A:
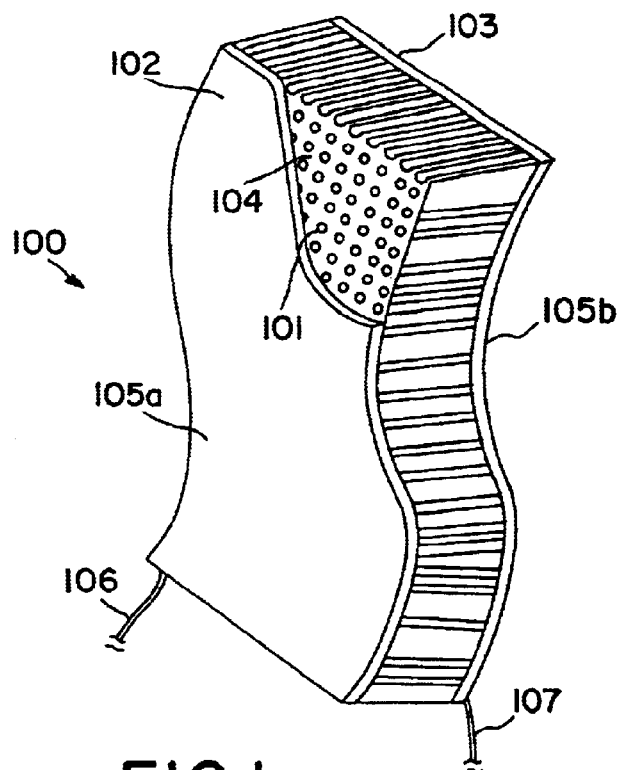
FIG. 1a and 1b show a piezoelectric fiber composite of the present invention having a large surface area.
Figure 1B:
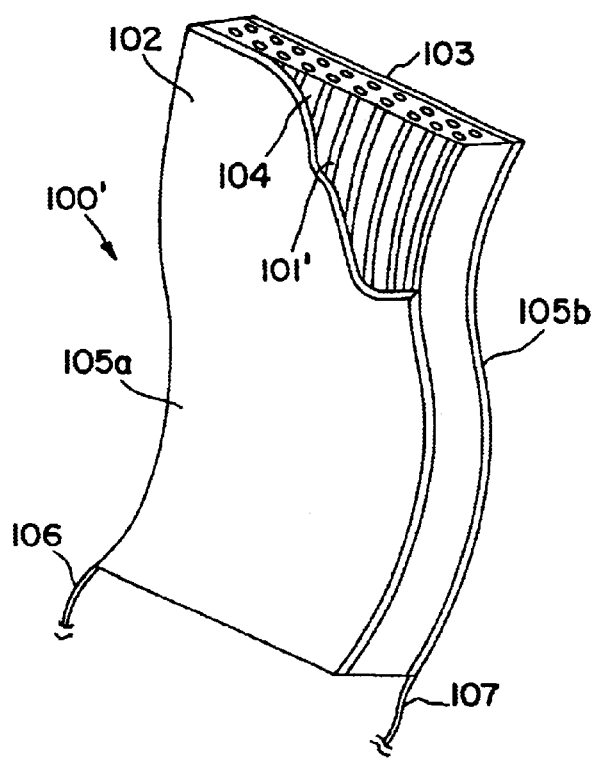

Referring to FIGS. 1a & 1b, preferred embodiments of the fiber composite of the present invention are shown. Fiber composites 100 and 100' comprise a multitude of individual fibers 101 of piezoelectric material held in a matrix material 104. Each fiber composite 100, 100' has opposing sides 102 and 103, also referred to herein as "active surfaces," which are substantially planar and parallel to one another. In the fiber composite of FIG. 1a, the fibers 101 are substantially normal to opposing sides 102 and 103, while in the fiber composite of FIG. 1b, the fibers 101' are substantially parallel to opposing sides 102 and 103. Although the fibers are shown both normal and parallel to the opposing sides, it should be understood that other configurations are within the scope of the invention, for example, the fibers may be at angle (other than normal) to the opposing sides. Fiber composites 100, 100' also comprises electrodes 105a and 105b on each side 102 and 103 from which extend leads 106 and 107, respectively. For illustrative purposes, a section of electrode 105a has been removed from side 102 of each fiber composite to reveal fibers 101, 101'.

An important feature of the fiber composite of the present invention is its controlled fiber characteristics, even over a large active surface. The term "fiber characteristics" refers to the concentration, orientation, consistency, type, shape, size, and electro-mechanical properties of the fibers in the fiber composite. By precisely controlling the fiber characteristics, the performance of the fiber composite can be precisely controlled.

The term "fiber concentration" herein refers to the fiber volume/composite volume and is typically stated as a percentage (e.g., a fiber composite having a volume of 100 cm$^3$ and a fiber volume 20 cm$^3$ has a fiber concentration of 20%). The fiber concentration in the fiber composite 100 depends upon the application. For example, transmitting applications tend to require higher fiber concentrations than receiving applications. With respect to sonar applications, it has been found that the fiber concentration for the receiver is preferably about 10 to about 20%, and more preferably about 18%, while the fiber concentration for the transmitter is preferably about 25 to about 35% and more preferably about 28 to about 32%. It may be preferable to vary the fiber concentration in a single composite between these two ranges to allow the composite to both transmit and receive with optimum performance. In such an embodiment, the sections of the composite having difference fiber concentrations would be coupled to different sets of electrodes and, thus, operate somewhat independently of one another.

With respect to ultrasound applications, it has been found that the fiber concentration is preferably about 35 to about 45% and more preferably about 38 to about 42%. With respect to sensors and actuators, it has been found that the fiber concentration is preferably at least about 50%, and, more preferably, at least about 75%. The fiber concentration for other applications can be determined by one skilled in the art in light of this disclosure without undue experimentation.

Although it may be preferable to vary the fiber concentration across the fiber composite between different sets of electrodes as mentioned above, it is generally preferred to maintain a high fiber consistency for all the fibers associated with a given set of electrodes. The term "fiber consistency" as used herein broadly refers to the uniformity of fiber material/properties throughout the fiber composite. The inventors submit that there are a variety of ways to quantify such fiber consistency and offer several approaches below as examples, although the present invention is not necessarily limited by any one of these quantifications unless otherwise indicated.

A preferred measure of fiber consistency is variation in fiber concentration per unit volume of fiber composite. Preferably, the variation of the fiber concentration/cm$^3$ of fiber composite does not exceed 20% of the composite's overall fiber concentration. More preferably, the variation of fiber concentration/cm$^3$ of composite does not exceed 10% of the overall fiber concentration. Even more preferably, the variation of the fiber concentration/cm$^3$ of composite does not exceed 5% of the overall fiber concentration. For example, in the more preferred embodiment, in which the variation of the fiber concentration/cm$^3$ of composite does not exceed 10% of the overall fiber concentration, if the fiber concentration of the composite is 30%, than the variation in fiber concentration is preferably no greater than about 3%/cm$^3$ of fiber composite, or, in other words, the fiber concentration is no less than 27%/cm$^3$ and no greater than 33%/cm$^3$.

Another measure of fiber consistency is the variation in the distance between adjacent fibers. As used herein, the distance between fibers is centerline distance. Preferably, the variation in distance does not exceed 30% of the average difference between fibers for the entire composite, more preferably, the variation in distance does not exceed 20% of the average difference between fibers, and, even more preferably, the variation in distance does not exceed 10% of the average difference between fibers. For example, in the more preferred embodiment in which the variation in distance does not exceed 20% of the average difference between fibers, if the average overall distance between fibers is 300 λm, than the variation between fibers cannot exceed 60 λm.

Rather than basing fiber consistency on a physical parameter of the fiber composite, fiber consistency may be related to the variation in properties across the fiber composite. Of primary importance in a fiber composite of piezoelectric material is its electro-mechanical response. The term "electromechanical response" as used herein refers to the mechanical response (i.e., actuation) of the fiber for a given electrical field, or, conversely, an electrical response for a given frequency of actuation. The actual measurement may be, for example, the magnitude of the response (e.g., volts, mm), the gain of the response (i.e., input:output), or the frequency of the response (e.g., Hz). Thus, in a preferred embodiment, the variation in the electromechanical response per $cm^3$ of fiber composite does not exceed about 25% of the overall electro-mechanical response of the fiber composite. More preferably, the variation of the electro-mechanical response/$cm^3$ of composite does not exceed 15% of the overall electro-mechanical response of the fiber composite. Even more preferably, the variation of the electro-mechanical response/$cm^3$ of composite does not exceed 10% of the overall electro-mechanical response of the fiber composite.

Another important feature of the fiber composite of the present invention is its large active surface (e.g., sides 102 and 103). This surface is larger than that achievable using fiber rope of equal fiber consistency. For example, as mentioned above, a fiber rope of adequate fiber consistency tends to be limited in diameter to about 1¼ in. which corresponds to a cross-sectional area of about 1.2 $in^2$. Accordingly, the active surface of the fiber composite of the invention has an area preferably greater than about 1.2 $in^2$, more preferably, greater than about 1.5 $in^2$, even more preferably, greater than about 3 $in^2$, and, still more preferably, greater than about 5 $in^2$.

Figure 2:
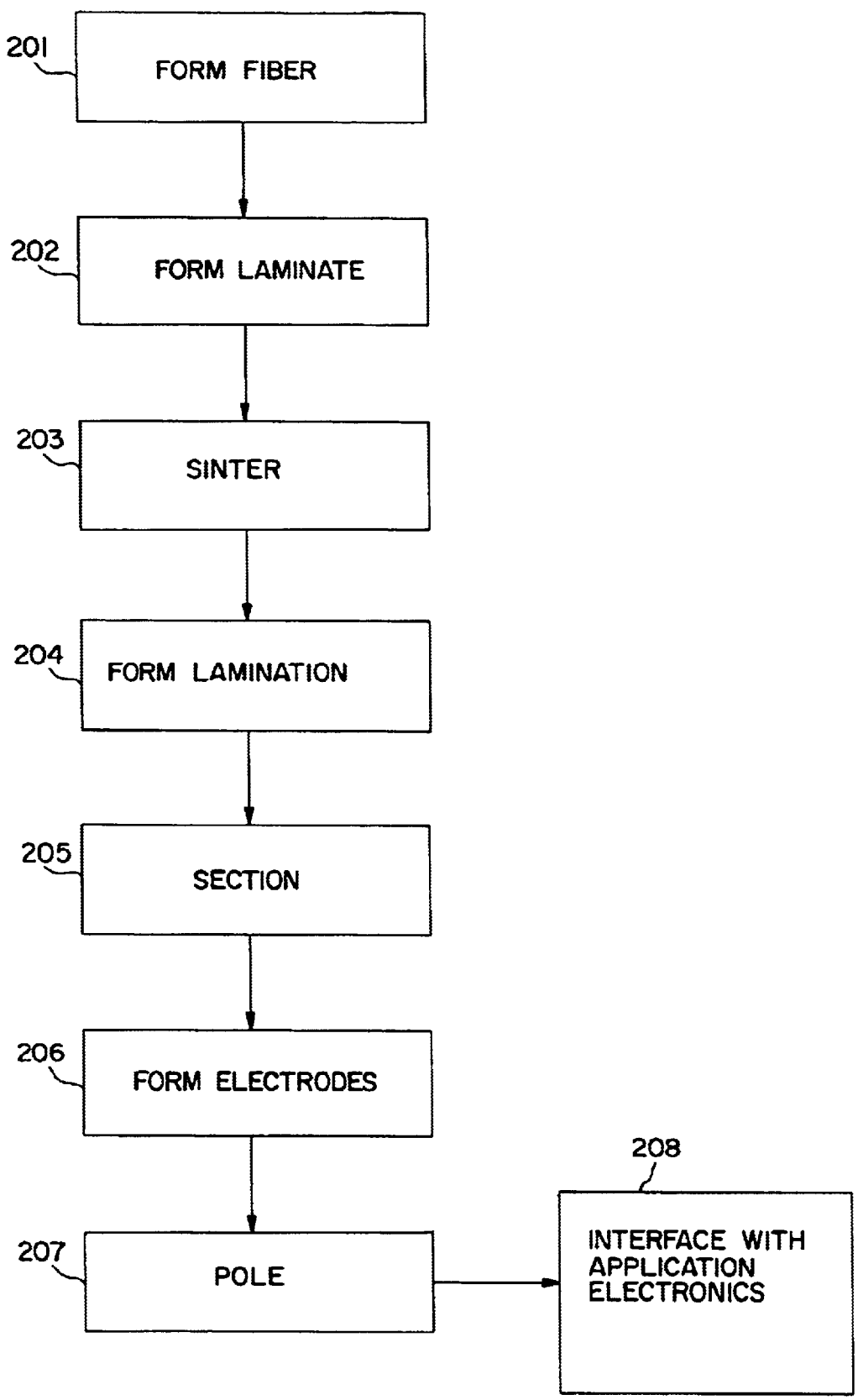
FIG. 2 shows a flow chart of a preferred method of preparing a fiber composite of the present invention.

Referring to FIG. 2, a flow chart is shown depicting the manufacturing steps to form a preferred fiber composite of the invention. In step 201, the fiber is prepared. Techniques for preparing piezoelectric fiber are known in the art, although preparing the fibers according to the spinning techniques described in U.S. Pat. No. 5,827,797 is preferred.

The fibers may be made of various electro-ceramic materials including, for example, all members of the PZT (lead zirconium titanate) family, lead niobate ($PbNbO_6$), lead titanate ($PbTiO_3$), barium titanate ($BaTiO_3$), electrostrictive materials, e.g. magnesium niobate ($MgNbO_6$), sodium bismoth titanate (pure or co-doped), other lead-based ceramics doped with lanthanum, tin, or niobium, and shape-memory piezoelectric materials (e.g., $Pb_3MgNb_2O_6$), and relaxor materials (ferroelectric/non ferroelectric). Preferably, the piezoelectric material is PZT. Suitable fibers made of piezoelectric material, such as PZT, are commercially available from Advanced Cerametrics, Lambertville, N.J. It should be understood, that although piezoelectric fibers are discussed herein in detail, the present invention may be practiced to manufacture an assembly of any type of ceramic fiber, including those disclosed in U.S. Pat. No. 5,827,797.

The diameter of the fibers used can vary depending upon the application. For example, lower frequency applications generally correspond to larger diameters. Additionally, it may be beneficial to use fibers of different diameters to effect a multi-frequency fiber composite. Given these considerations, fiber diameters ranging from about 5 to about 300 λm are typical. Although circular fibers are preferred, it should be understood that fiber geometry may be varied within the scope of the invention. For example, the fibers may be formed with a square or rectangular cross section by extruding fibers through a square die. Such a geometry may be preferred in fact to effect high fiber concentrations since square fibers tend to pack tighter than circular fibers.

The length of the fiber may be adjusted depending on the size of the desired fiber assembly. In a preferred embodiment, the fibers are cut from a spool of fiber obtained using the wet spinning technique disclosed in U.S. Pat. No. 5,827,797 mentioned above. More specifically, the spool is divided into arcuate sections, each section containing many fibers, the exact number corresponding to the number of turns on the spool.

One the fiber are manufactured, then a laminate is formed in step 202. To this end, the fibers prepared in step 201 are laid in a tray in substantially parallel alignment. To effect the substantially parallel alignment, it may be preferable to comb the fibers. It should be understood, however, that an exact parallel alignment is not necessary, as the applicants have found that this configuration increases the likelihood of producing harmonics in the fiber composite and experiencing a Lamb wave mode of vibration.

The thickness of the layer depends on a number of factors one of which being the desired degree of control over fiber consistency. Generally, thick layers correspond to less control over fiber consistency. One skilled in the art can readily determine the thickness corresponding to the desired fiber consistency. Another factor relating to layer thickness is fiber diameter. Generally, larger diameters fibers correspond to thicker layers. Given these considerations, a typical layer comprises a stack of fibers ranging from about 4 to about 30 fibers thick which generally corresponds to a thickness of about 40 to about 500 λm.

Once the fibers have been formed into a layer and adequately arranged, the fibers are sintered in step 203 using conventional techniques and equipment. For example, in preparing a layer of PZT fibers, it has been found that adequate results can be achieved at temperatures ranging from about 1150 to about 1300° C. in a lead-rich atmosphere. The sintering time can range significantly, for example, from about 45 minutes to 10 hrs, depending upon the thickness of the layer and desired degree of sintering. In addition to homogenizing the particles of PZT material into a fiber, there is also a certain amount of cross linking occurring between the various fibers such that, after sintering, the fibers in the layer are coupled. This facilitates handling as the layer is now one piece.

Figure 3:
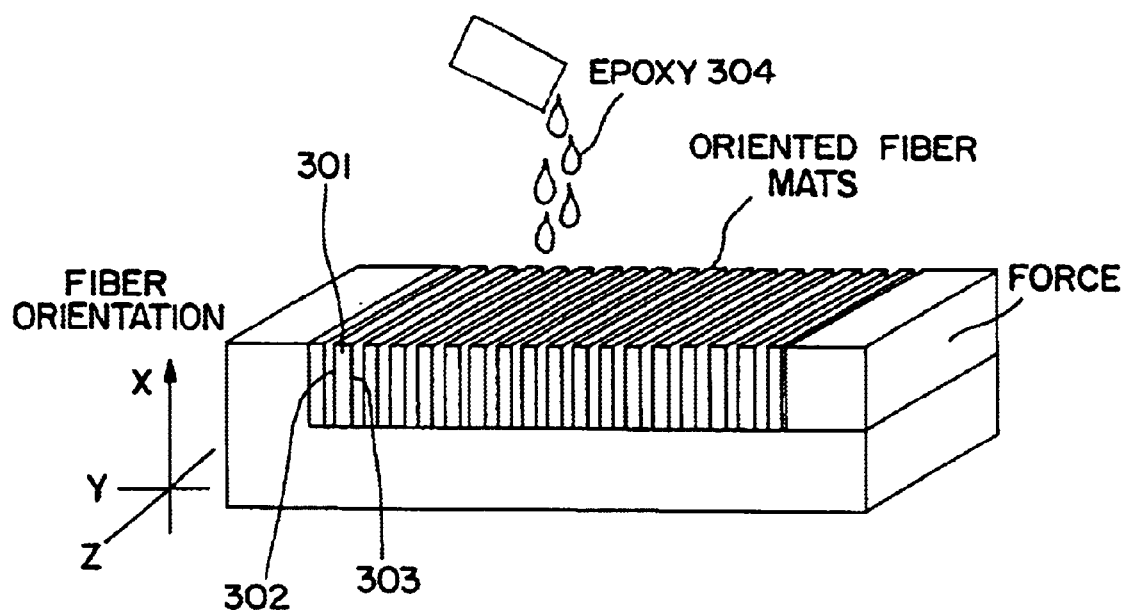
FIG. 3 schematically represents forming the fiber assembly of FIG. 2 by laminating a number of planar layers.

Following sintering in step 203, the laminates are assembled and formed into a fiber assembly in step 204. A schematic of this assembly step is shown in FIG. 3. As shown, the sintered layers 301 are aligned with their planar surfaces 302, 303 adjacent one another and are then pressed together. In this embodiment, the fibers are orientated along the x-axis, although they may just as well be aligned along the y axis instead. To hold the layers together in this configuration, a matrix material 304 is used.

The preferred matrix material is a soft and deformable polymer. Preferably, the Young's modulus is below about 50 GPa, e.g., about 3–10 GPa. The Young's modulus of the polymer is preferably at least 5 or 10 times less than the Young's modulus of the piezoelectric fibers, which for most materials is about 60 GPa. Polymers which may be used include thermosetting and thermoplastic families of polymers, including epoxies, polyamides and cross-linked polyamides, polyvinyl chlorides, polyethylenes, and active polymers that exhibit electromechanical coupling, e.g. polyvinyl difluoride (PVDF). The polymer may also include additives to achieve desired elastic and dielectric properties. For example, to increase the dielectric constant of the polymer, high-dielectric-constant particles or fibers composed of graphite, metal, ceramic, or electroceramic materials may be added. Furthermore, in ultrasound or sonar applications, it is preferable to introduce additives or use a polymer which is acoustically matched to the frequency of the application. Preferred matrix materials include epoxy polymers.

When applying the matrix material to the assembly of sintered layers, preferably a vacuum is drawn such that air is evacuated from the interstices of the sintered layers and the matrix material is drawn in. To this end, the assembly is contained in a flexible vacuum bag connected to a vacuum pump. When a vacuum is drawn in the bag, the bag collapses around the mold which facilitates compression during curing at a pressure of about one atmosphere. In addition, the vacuum condition within the bag allows air bubbles to be removed from the epoxy prior to curing to insure maximum compaction. Typically, a vacuum of approximately 30 in Hg is applied to the system overnight without heat to minimize voids. It is desirable to keep void content in the composite to a minimum since the dielectric strength of epoxy and piezoelectric fibers is four to five times higher than that of air, and voids present locations across which the applied voltage may arc. Consequently, high void concentrations in the composite may make it difficult to reach the poling voltages In an alternative embodiment, layers 301 are impregnated with matrix material individually and then laminated to form the composite assembly by adhering the layers together and/or by pressing the layers together and heating them such that the matrix material in the individual layers reflows and combines with the matrix material of adjacent layers. It should be understood that other lamination techniques or a combination of one or more of techniques is within the scope of invention.

Curing is well known in the art and can be accomplished by heating the structure to a temperature and applying pressure for a time period appropriate for a particular polymer system.

Figure 4:
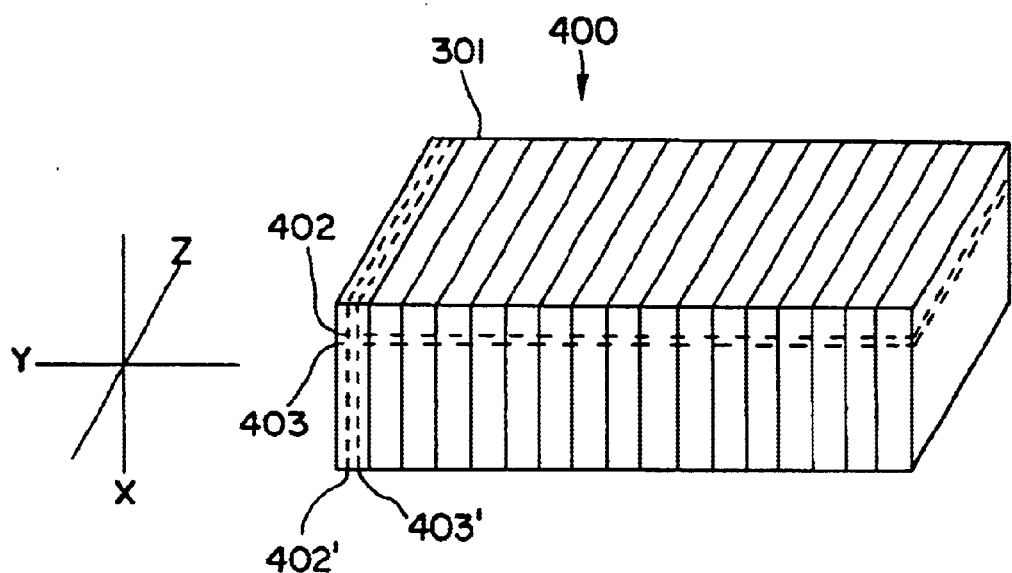
FIG. 4 shows a fiber assembly of the present invention fabricated in accordance with the method depicted in FIG. 3 from which the fiber composite of FIG. 1 is derived.

Referring now to FIG. 4, the composite structure formed from the process described above is shown. It is worthwhile to note that although individual layers 301 are depicted in assembly 400, this is done for illustrative purposes and the interface between the various layers may likely be indistinguishable once assembled. The fiber consistency described above with respect to fiber composite 100 is manifested in the fiber assembly 400.

Once the fiber assembly 400 is formed, individual fiber composites may be sectioned from it in step 205. For example, assuming that the fibers are oriented along the x axis as in FIG. 3, the dotted lines 402 and 403 on fiber assembly 400 indicate the cross sections corresponding to the surfaces 102 and 103 of fiber composite 100 of FIG. 1a in which the fibers are substantially normal to the opposing surfaces. The dotted lines 402' and 403' on fiber assembly 400 indicate the cross sections corresponding to the surfaces 102 and 103 of fiber composite 100' of FIG. 1b in which the fibers are substantially parallel to the opposing surfaces.

It should be understood that the fiber composites 100, 100' of any thickness can be sectioned from assembly 400. Thus, a multitude of fiber composites 100 can be derived from a single fiber assembly 400. Conversely, it is well within the scope of the invention for a fiber composite to comprise the entire fiber assembly 400.

The thickness of the fiber composite depends on the orientation of the fibers in the composite and on the application. To achieve optimum performance, the thickness of the fiber composite 100' te nds to be less than that of fiber composite 100. More specifically, to achieve the highest degree of response from a fiber, it is preferred that the electrodes are intimately close to and more preferably contacting the fibers. Since the fibers are parallel to the electrodes in the fiber composite 100', only the fibers along the opposing surfaces are intimate with the electrodes. If the composite is more than two fibers thick, the interior fibers will be separated from the electrodes and, thus, their electrical coupling to the electrodes will be severely diminished. Therefore, for composite 100', it is generally preferred that it not be substantially more than two fibers thick.

The application of the fiber composite also plays a significant role in determining the thickness of the fiber composite. For example, space and flexibility requirements may necessitate a fairly narrow fiber composite 100. On the other hand, to maximize the lengthwise pole direction of the fibers, it may be desirable to increase the thickness of the fiber composite 100. It is well known that increasing the length of the fibers along the pole direction will enhance their energy harvesting and actuating properties. Given these considerations, typical fiber composite thickness range from about 4 $\lambda$m to about 1 in.

Once the fiber composite has been sectioned from the composite assembly, it may be fitted with electrodes in step 206. The electrode may be any conductive surface and suitable configurations thereof are well known in the art, including, for example, interdigitized configurations. The electrode is preferably a thin, flexible conductive layer which does not restrain the composite or the structural component during actuation. Suitable conductive materials include, for example, silver, aluminum, copper, and gold, as well as non-metallic conductors such as conductive polymers. Of these materials, silver is preferred. The conductive material may be applied to the fiber composite in various ways including for example, vapor deposition, sputtering, ink film, and electron beam evaporation at low power, or the electrode layers may be formed of a thin polymer substrate coated with an ultra-thin layer of metal. Preferably, the electrode layer is applied by sputtering.

The piezoelectric fiber composites may be poled in step 207 using known techniques. For example, they may be poled by placing them into a hot oil bath, typically at a temperature of 80° C. The hot oil serves two functions: (1) arcing and dielectric breakdown are reduced by the presence of the oil, and (2) the heat facilitates alignment of the dipoles. Poling is typically carried out for a certain time and voltage level typically depending on the size of the fiber composite. Following poling, the fiber composite can be activated by attaching the electrodes to a voltage source using wires or conductive tape.

Once prepared, the piezoelectric fiber composite may be coupled to control circuitry in step 208. Preferably, the fiber composite is coupled to a control unit by making an electrical connection to the conductive electrode layers. The control unit preferably includes an analog-to-digital converter to process electrical signals from the fiber composite layer, a computer to analyze the processed signal from the sensor, and an amplifier which receives a signal from the computer and sends an actuating electrical signal to the fiber composite. The magnitude, frequency, waveform, etc. of the actuating signal is determined based on the nature of the desired displacement for the particular application.

Once the fiber assembly is interfaced with its control electronics, the piezoelectric material of fibers 101 will generate an electrical potential between electrodes 105a and 105b upon being physically deformed. This electrical potential is conducted through leads 106 and 107 and may provide electrical energy for energy harvesting purposes or a signal for measurement purposes. Conversely, when an electrical potential is applied between electrodes 105a and 105b across the fibers 101', the fibers deform or "actuate."

The inventors have recognized a wide range of applications using the fiber composite of the present invention given its relatively large area and high fiber consistency. For illustrative purposes, these applications have been categorized below in terms of energy harvesting, wave transmitting/receiving, sensing and combinations of energy harvesting/sensing and actuation. It should be understood that this categorization is for illustrative purposes only and should not be construed to limit the scope of the invention.

1. Energy Harvesting

The large active surface area obtainable with the fiber composite of the present invention makes it particularly well suited for harvesting energy. More specifically, since the fiber composite may be configured to have a large active surface, it casts a "wide net" to collect energy. Thus, in applications in which the energy is dispersed over an area, the composite of the invention is able to convert the energy into electrical power. For example, a thin fiber composite may be used in the sole of a shoe such that every time a user takes a step and applies the weight of his body against the fiber composite, voltage will be generated. The electrical response may be stored in a capacitor or other type of energy storage means for use in powering accessories such as lights, radios, boot heaters, and battery chargers.

2. Wave Transmitting/Receiving

Given its large active surface area, flexible nature, and controlled fiber characteristics, the fiber composite of the present invention is particularly well suited for wave transmitting/receiving. For example, a fiber composite may be molded into the nose cone of a submarine. In a preferred embodiment, the fiber composite has fibers of different diameters to operate at different frequencies. Accordingly, a single fiber composite may contain both the transmitter and receiver, thereby minimizing components and reducing space requirements which is paramount on a submarine.

Another example of the composite's versatility is in the field of ultrasound bone-healing applications. Preferably, a thin, flexible fiber composite is used to conform to a person's body and thereby provide direct contact between the fiber composite and the skin, thereby minimizing air gaps which attenuate ultrasound signals.

Yet another example of the composite's use is underwater listening for oil exploration and fish finding as well as underwater wave transmitting for attracting fish.

3. Sensing

The versatility and robust nature of the composite of the present invention also makes it ideal for sensing applications in which the sensor needs to conform to an infrastructure or housing. For example, a thin fiber composite may be stitched into clothing or integrally formed therein in contact sports for scoring purposes or for determining the severity of impacts. For example, such fiber composites may be incorporated into fencing attire to provide reliable indications of sword contact and/or the severity of the contact.

Another example of a sensor application involves the incorporation of the fiber composites into highway structures such as bridges and roads to monitor stress thereon and to measure vehicle traffic and weight.

4. Combination Sensing/Energy Harvesting and Actuating

The inventors have recognized that integrating the sensing, actuation and energy harvesting capabilities of piezoelectric materials allows the composites to be self sufficient in certain application without the need for external power or actuation control. For example, such fiber composites may be used in air bag deployment configurations. In a preferred embodiment, the fiber composite acts as an accelerometer to sense rapid deceleration, it acts as an energy harvesting device obtain energy from the deceleration to provide power to control circuitry, and it acts as an actuator by deploying the air bag following a signal from the control circuitry.

Another example of an integrated system involves using fiber composites to harvest vibration energy. This vibration energy is then used to power circuitry which controls the actuation of the composite to dampen vibration. Particular examples include using fiber composites to damped vibration in sports equipment, such as tennis rackets, or using fiber composites in a self-propelled device, such as a rocket, to harvest vibration energy or the energy of a tail flapping in the wind to power control circuitry of the device.

What is claimed is:

1. A method of manufacturing a fiber assembly, said method comprising:

providing a plurality of planar layers, each layer comprising sintered fibers of piezoelectric material aligned substantially parallel;

arranging said plurality of planar layers in a side-by-side relationship such that the planes of the planar layers are substantially parallel; and applying a matrix material to the arranged layers to affix said layers and form a fiber assembly.

2. The method of claim 1, further comprising:

sectioning a portion from said fiber assembly.

3. The method of claim 2, wherein said portion has two opposing surfaces and contains fibers that are substantially normal to said opposing surfaces.

4. The method of claim 2, wherein said portion has two opposing surfaces and contains fiber that are substantially parallel to said opposing surfaces.

5. The method of claim 2, further comprising:

applying at least one electrode to each opposing surface.

6. The method of claim 5, wherein a plurality of interdigitized electrodes are applied.

7. The method of claim 2, further comprising poling said sectioned portion.

8. The method of claim 2, wherein each opposing side of said portion has an area greater than about 1.5 cm$^2$.

9. The method of claim 2, wherein the variation of fiber concentration in no greater than about 20%/cm$^3$.

10. The method of claim 1, wherein arranging said planar layers comprises interleaving planar layers of varying fiber characteristics.

11. The method of claim 10, wherein said layers of varying fiber characteristics have different fiber concentrations.

12. The method of claim 10, wherein said layers of varying fiber characteristics have fibers of different average diameters.

13. The method of claim 10, wherein a different set of electrodes is applied to said layers of varying fiber characteristics.

14. The method of claim 1, wherein said layers have substantially similar fiber characteristics.

15. The method of claim 1, wherein said piezoelectric material is at least one of PZT (lead zirconium titanate), lead niobate (PbNbO$_6$), lead titanate (PbTiO$_3$), barium titanate (BaTiO$_3$), sodium bismoth titanate (pure or co-doped), lead-based ceramics doped with lanthanum, tin, or niobium, electrostrictive materials, memory piezoelectric materials, or relaxor materials.

* * * * *